United States Patent
Xiao

(10) Patent No.: US 9,123,803 B2
(45) Date of Patent: Sep. 1, 2015

(54) SEMICONDUCTOR DEVICE AND METHOD FOR FABRICATING THE SAME

(71) Applicant: SHANGHAI HUA HONG NEC ELECTRONICS CO., LTD., Shanghai (CN)

(72) Inventor: Shengan Xiao, Shanghai (CN)

(73) Assignee: SHANGHAI HUA HONG NEC ELECTRONICS CO., LTD., Shanghai (CN)

(*) Notice: Subject to any disclaimer, the term of this patent is extended or adjusted under 35 U.S.C. 154(b) by 0 days.

(21) Appl. No.: 13/968,687

(22) Filed: Aug. 16, 2013

(65) Prior Publication Data
US 2014/0048878 A1  Feb. 20, 2014

(30) Foreign Application Priority Data
Aug. 17, 2012  (CN) .......................... 2012 1 0295845

(51) Int. Cl.
| H01L 29/00  | (2006.01) |
| H01L 29/78  | (2006.01) |
| H01L 29/66  | (2006.01) |
| H01L 29/417 | (2006.01) |
| H01L 29/40  | (2006.01) |
| H01L 29/45  | (2006.01) |
| H01L 29/49  | (2006.01) |

(52) U.S. Cl.
CPC ........ *H01L 29/7816* (2013.01); *H01L 29/4175* (2013.01); *H01L 29/41766* (2013.01); *H01L 29/66659* (2013.01); *H01L 29/66681* (2013.01); *H01L 29/7835* (2013.01); *H01L 29/402* (2013.01); *H01L 29/456* (2013.01); *H01L 29/4933* (2013.01); *H01L 29/665* (2013.01)

(58) Field of Classification Search
CPC . H01L 29/456; H01L 29/4933; H01L 29/665; H01L 29/7816; H01L 29/66681; H01L 29/402
See application file for complete search history.

(56) References Cited

U.S. PATENT DOCUMENTS

| 8,749,018 B2* | 6/2014 | Stecher et al. ............. 257/500 |
| 2002/0190285 A1* | 12/2002 | Sakamoto et al. ......... 257/288 |
| 2007/0264824 A1* | 11/2007 | Siew et al. ................. 438/672 |
| 2008/0308862 A1* | 12/2008 | Theeuwen et al. ......... 257/328 |
| 2011/0012196 A1* | 1/2011 | Williams et al. ........... 257/343 |

* cited by examiner

*Primary Examiner* — Su C Kim
(74) *Attorney, Agent, or Firm* — MKG LLC

(57) ABSTRACT

A semiconductor device includes: a P+ substrate; a P− epitaxial layer over the P+ substrate; a P-well and an N− drift region in the P− epitaxial layer and laterally adjacent to each other; an N+ source region in the P-well and connected to a front-side metal via a first contact electrode; an N+ drain region in the N− drift region and connected to the front-side metal via a second contact electrode; a gate structure on the P− epitaxial layer and connected to the front-side metal via a third contact electrode; and a metal plug through the P− epitaxial layer and having one end in contact with the P+ substrate and the other end connected to the front-side metal, the metal plug being adjacent to one side of the N+ source region that is farther from the N− drift region. A method for fabricating the semiconductor device is also disclosed.

2 Claims, 14 Drawing Sheets

SEMICONDUCTOR DEVICE AND METHOD FOR FABRICATING THE SAME

CROSS-REFERENCES TO RELATED APPLICATIONS

This application claims the priority of Chinese patent application number 201210295845.9, filed on Aug. 17, 2012, the entire contents of which are incorporated herein by reference.

TECHNICAL FIELD

The present invention relates to a semiconductor device and a method for fabricating the semiconductor device.

BACKGROUND

Radio frequency (RF) laterally diffused metal oxide semiconductor (LDMOS) device has gained high mark acceptance. In particular, with the increasingly wide applications of the telecommunications technology, RF LDMOS device, as a new kind of power device, will get more and more attentions.

FIG. 1 depicts the fundamental structure of a conventional RF LDMOS device. It typically includes a heavily doped P-type substrate (with a resistivity of 0.01 $\Omega\cdot$cm to 0.02 $\Omega\cdot$cm). A P-type epitaxial layer is grown on the P-type substrate. The thickness and doping concentration of the P-type epitaxial layer are determined by the specific requirement for a voltage resistance property of the RF LDMOS device (e.g., a voltage resistance of 60 V requires a thickness of 5 µm to 8 µm of the P-type epitaxial layer). Additionally, a P+ sinker is formed through the P-type epitaxial layer and contact with the heavily doped P-type substrate by performing implantation and diffusion processes. The structure further includes a P-well, a gate oxide layer, a gate, an N− drift region, an N+ source region, an N+ drain region, external electrodes (including a source electrode S, a drain electrode D and a gate electrode G), and a metal layer deposited over a backside of the substrate after the substrate is grinded. In the structure of FIG. 1, the source electrode S, or the N+ source region, is connected to the P+ substrate via the P+ sinker.

As the P+ sinker is formed by a diffusion approach, the above described structure suffers from some deficiencies. For example, one deficiency is that lateral diffusion of the P+ sinker increases difficulty in shrinking the area of the device, and another deficiency is that the P+ sinker has a high resistance which affects the performance of the device, especially its working frequency. For this reason, it has been proposed in the prior art to use P+ polysilicon to form the P+ sinker. This approach could help to rectify the above mentioned deficiencies. However, it still has two drawbacks as follows: first, due to limitations in process control, the P+ polysilicon process is not mature and has not been widely used; and secondly, the lateral diffusion issue still exists and the sinker resistance is still much higher than a metal resistance.

SUMMARY OF THE INVENTION

The present invention is directed to the provision of a semiconductor device with reduced gate resistance and improved device performance. To that end, the present invention also provides a method for fabricating such a device.

To achieve the above objectives, the semiconductor device of the present invention may include: a P+ substrate; a P− epitaxial layer formed over the P+ substrate; a P-well and an N− drift region, formed in an upper portion of the P− epitaxial layer and laterally adjacent to each other; an N+ source region formed in the P-well and connected to a front-side metal via a first contact electrode; an N+ drain region formed in the N− drift region and connected to the front-side metal via a second contact electrode; a gate structure formed on the P− epitaxial layer and connected to the front-side metal via a third contact electrode; and a metal plug formed through the P− epitaxial layer and having one end in contact with the P+ substrate and the other end connected to the front-side metal, the metal plug being adjacent to one side of the N+ source region that is farther from the N− drift region.

Optionally, the gate structure may include a gate silicon oxide film, a polysilicon gate and a gate metal silicide layer, stacked in this order, and dielectric sidewalls on both sides of the stacked silicon oxide film, polysilicon gate and gate metal silicide layer.

Optionally, the semiconductor device may further include a source/drain metal silicide layer formed between the N+ source region and the first contact electrode and between the N+ drain region and the second contact electrode.

Optionally, the source/drain metal silicide layer may be formed of one or more selected from the group consisting of a titanium-silicon alloy, a cobalt-silicon alloy, a niobium-silicon alloy and a molybdenum-silicon alloy.

Optionally, the semiconductor device may further include an intermediate dielectric layer over the P− epitaxial layer, the gate structure and the source/drain metal silicide layer, and the front-side metal is formed above the intermediate dielectric layer.

Optionally, each of the first, second and third contact electrodes may be formed through the intermediate dielectric layer, and the metal plug is formed through both of the intermediate dielectric layer and the P− epitaxial layer.

Optionally, the semiconductor device may further include a dielectric film covering the P− epitaxial layer, the gate structure and the source/drain metal silicide layer, and a shielding metal film on the dielectric film, covering a portion of the gate structure and a portion of the N− drift region, and the intermediate dielectric layer covers both of the dielectric film and the shielding metal film.

Optionally, the semiconductor device may further include a fourth contact electrode in the intermediate dielectric layer for connecting the shielding metal film with the front-side metal.

Optionally, the metal plug may include a metal adhesion layer, a metal barrier layer and a filler metal.

The semiconductor device may be fabricated using a method including the steps of:

providing a P+ substrate;

forming a P− epitaxial layer over the P+ substrate;

forming a P-well and an N− drift region in an upper portion of the P− epitaxial layer, the P-well and the N− drift region being laterally adjacent to each other;

forming an N+ source region in the P-well, the N+ source region being connected to a front-side metal via a first contact electrode;

forming an N+ drain region in the N− drift region, the N+ drain region being connected to the front-side metal via a second contact electrode;

forming a gate structure on the P− epitaxial layer, the gate structure being connected to the front-side metal via a third contact electrode; and forming a metal plug through the P− epitaxial layer, the metal plug having one end in contact with the P+ substrate and the other end connected to the front-side metal, the metal plug being adjacent to one side of the N+ source region that is farther from the N− drift region.

Optionally, the method may include the steps of:

1) growing the P− epitaxial layer over the P+ substrate and successively stacking a gate silicon oxide film, a polysilicon gate and a gate metal silicide layer on the P− epitaxial layer, forming dielectric sidewalls on both sides of the stacked gate silicon oxide film, polysilicon gate and gate metal silicide layer, forming the P-well in an upper portion of the P− epitaxial layer and the N+ source region in the P-well, forming the N+ drain region in an upper portion of the P− epitaxial layer, forming the N− drift region encircling the N+ drain region and being adjacent to the P-well, and forming a source/drain metal silicide layer on a top face of the P− epitaxial layer, the source/drain metal silicide layer covering both the N+ source region and the N+ drain region;

2) depositing an intermediate dielectric layer over the P− epitaxial layer, covering the source/drain metal silicide layer, the stacked gate silicon oxide film, polysilicon gate and gate metal silicide layer and the dielectric sidewalls, and planarizing the intermediate dielectric layer using a CMP process or an etch-back process;

3) performing photolithographic and etching process on the intermediate dielectric layer to form therein a drain contact hole, a source contact hole, a gate trench above the gate, and a dielectric trench for the metal plug on one side of the N+ source region that is farther from the N− drift region;

4) coating a photoresist on a top face of the intermediate dielectric layer and filling the drain contact hole, the source contact hole, the gate trench and the dielectric trench, opening the dielectric trench by photolithography while leaving the rest portions protected by the photoresist or opening the gate trench and the dielectric trench by photolithography while leaving the rest portions protected by the photoresist, etching in the dielectric trench to form a deep trench through the P− epitaxial layer, and removing the photoresist;

5) depositing a metal adhesion layer and a metal barrier layer on the metal adhesion layer in each of the drain contact hole, the source contact hole, the gate trench, the dielectric trench and the deep trench, filling the drain contact hole, the source contact hole, the gate trench, the dielectric trench and the deep trench with a filler metal, and removing an undesired portion of the filler metal above the intermediate dielectric layer using a CMP process; and 6) forming a front-side metal on the intermediate dielectric layer covering the drain contact hole, the source contact hole, the gate trench and the dielectric trench, grinding the P+ substrate and depositing a back-side metal over the backside of the P+ substrate, wherein a portion of the front-side metal above the gate trench serves as a gate electrode; a portion of the front-side metal above the drain contact hole serves as a drain electrode; a portion of the front-side metal above the source contact hole is connected to a portion of the front-side metal above the dielectric trench by a metal wire such that the filler metal in the dielectric trench and the deep trench is electrically connected to the N+ source region via the filler metal in the source contact hole; the back-side metal serves as a source electrode.

Optionally, the method may include the steps of:

a) growing the P− epitaxial layer over the P+ substrate and successively stacking a gate silicon oxide film, a polysilicon gate and a gate metal silicide layer on the P− epitaxial layer, forming dielectric sidewalls on both sides of the stacked gate silicon oxide film, polysilicon gate and gate metal silicide layer, forming the P-well in an upper portion of the P− epitaxial layer and the N+ source region in the P-well, forming the N+ drain region in an upper portion of the P− epitaxial layer, forming the N− drift region encircling the N+ drain region and being adjacent to the P-well, and forming a source/drain metal silicide layer on a top face of the P− epitaxial layer, the source/drain metal silicide layer covering both the N+ source region and the N+ drain region;

b) depositing an intermediate dielectric layer over the P− epitaxial layer, covering the source/drain metal silicide layer, the stacked gate silicon oxide film, polysilicon gate and gate metal silicide layer and the dielectric sidewalls, and planarizing the intermediate dielectric layer using a CMP process or an etch-back process;

c) performing photolithographic and etching process on the intermediate dielectric layer to form therein a drain contact hole, a source contact hole, a gate trench above the gate, and a dielectric trench for the metal plug on one side of the N+ source region that is farther from the N− drift region;

d) coating a photoresist on a top face of the intermediate dielectric layer and filling the drain contact hole, the source contact hole, the gate trench and the dielectric trench, opening the dielectric trench by photolithography while leaving the rest portions protected by the photoresist, etching in the dielectric trench to form a deep trench through the P− epitaxial layer, implanting P-type ions into side faces of the deep trench by tilted implantation, and removing the photoresist;

e) depositing a metal adhesion layer and a metal barrier layer on the metal adhesion layer in each of the drain contact hole, the source contact hole, the gate trench, the dielectric trench and the deep trench, filling the drain contact hole, the source contact hole, the gate trench, the dielectric trench and the deep trench with a filler metal, and removing an undesired portion of the filler metal above the intermediate dielectric layer using a CMP process; and f) forming a front-side metal on the intermediate dielectric layer covering the drain contact hole, the source contact hole, the gate trench and the dielectric trench, grinding the P+ substrate and depositing a back-side metal over the backside of the P+ substrate, wherein a portion of the front-side metal above the gate trench serves as a gate electrode; a portion of the front-side metal above the drain contact hole serves as a drain electrode; a portion of the front-side metal above the source contact hole is connected to a portion of the front-side metal above the dielectric trench by a metal wire such that the filler metal in the dielectric trench and the deep trench is electrically connected to the N+ source region via the filler metal in the source contact hole; the back-side metal serves as a source electrode.

Optionally, the method may include the steps of:

A) growing the P− epitaxial layer over the P+ substrate and successively stacking a gate silicon oxide film, a polysilicon gate and a gate metal silicide layer on the P− epitaxial layer, forming dielectric sidewalls on both sides of the stacked gate silicon oxide film, polysilicon gate and gate metal silicide layer, forming the P-well in an upper portion of the P− epitaxial layer and the N+ source region in the P-well, forming the N+ drain region in an upper portion of the P− epitaxial layer, forming the N− drift region encircling the N+ drain region and being adjacent to the P-well, and forming a source/drain metal silicide layer on a top face of the P− epitaxial layer, the source/drain metal silicide layer covering both the N+ source region and the N+ drain region;

B) depositing an intermediate dielectric layer over the P− epitaxial layer, covering the source/drain metal silicide layer, the stacked gate silicon oxide film, polysilicon gate and gate metal silicide layer and the dielectric sidewalls, and planarizing the intermediate dielectric layer using a CMP process or an etch-back process;

C) performing photolithographic and etching process on the intermediate dielectric layer to form therein a drain contact hole, a source contact hole, and a gate trench above the gate therein;

D) coating a photoresist on a top face of the intermediate dielectric layer and filling the drain contact hole, the source contact hole and the gate trench, opening a metal plug area, which is on one side of the N+ source region farther from the N− drift region, by photolithography while leaving the rest areas protected by the photoresist, etching the intermediate dielectric layer and the P− epitaxial layer to form a dielectric trench in the intermediate dielectric layer and a deep trench through the P− epitaxial layer, and removing the photoresist;

E) depositing a metal adhesion layer and a metal barrier layer on the metal adhesion layer in each of the drain contact hole, the source contact hole, the gate trench, the dielectric trench and the deep trench, filling the drain contact hole, the source contact hole, the gate trench, the dielectric trench and the deep trench with a filler metal, and removing an undesired portion of the filler metal above the intermediate dielectric layer using a CMP process; and F) forming a front-side metal on the intermediate dielectric layer covering the drain contact hole, the source contact hole, the gate trench and the dielectric trench, grinding the P+ substrate and depositing a back-side metal over the backside of the P+ substrate, wherein a portion of the front-side metal above the gate trench serves as a gate electrode; a portion of the front-side metal above the drain contact hole serves as a drain electrode; a portion of the front-side metal above the source contact hole is connected to a portion of the front-side metal above the dielectric trench by a metal wire such that the filler metal in the dielectric trench and the deep trench is electrically connected to the N+ source region via the filler metal in the source contact hole; the back-side metal serves as a source electrode.

Optionally, the method may include the steps of:

i) growing the P− epitaxial layer over the P+ substrate and successively stacking a gate silicon oxide film, a polysilicon gate and a gate metal silicide layer on the P− epitaxial layer, forming dielectric sidewalls on both sides of the stacked gate silicon oxide film, polysilicon gate and gate metal silicide layer, forming the P-well in an upper portion of the P− epitaxial layer and the N+ source region in the P-well, forming the N+ drain region in an upper portion of the P− epitaxial layer, forming the N− drift region encircling the N+ drain region and being adjacent to the P-well, and forming a source/drain metal silicide layer on a top face of the P− epitaxial layer, the source/drain metal silicide layer covering both the N+ source region and the N+ drain region;

ii) depositing an intermediate dielectric layer over the P− epitaxial layer, covering the source/drain metal silicide layers, the stacked gate silicon oxide film, polysilicon gate and gate metal silicide layer and the dielectric sidewalls, and planarizing the intermediate dielectric layer using a CMP process or an etch-back process;

iii) performing photolithographic and etching process on the intermediate dielectric layer to form therein a drain contact hole and a source contact hole;

iv) coating a photoresist on a top face of the intermediate dielectric layer and filling the drain contact hole and the source contact hole, opening an area above the gate and a metal plug area which is on one side of the N+ source region farther from the N− drift region by photolithography while leaving the rest areas protected by the photoresist, etching the intermediate dielectric layer and the P− epitaxial layer to form a gate trench connected to the gate, a dielectric trench in the intermediate dielectric layer and a deep trench through the P− epitaxial layer, and removing the photoresist;

v) depositing a metal adhesion layer and a metal barrier layer on the metal adhesion layer in each of the drain contact hole, the source contact hole, the gate trench and the deep trench, filling the drain contact hole, the source contact hole, the gate trench and the deep trench with a filler metal, and removing an undesired portion of the filler metal that is above the intermediate dielectric layer using a CMP process; and vi) forming a front-side metal on the intermediate dielectric layer covering the drain contact hole, the source contact hole, the gate trench and the dielectric trench, grinding the P+ substrate and depositing a back-side metal over the backside of the P+ substrate, wherein a portion of the front-side metal above the gate trench serves as a gate electrode; a portion of the front-side metal above the drain contact hole serves as a drain electrode; a portion of the front-side metal above the source contact hole is connected to a portion of the front-side metal above the dielectric trench by a metal wire such that the filler metal in the dielectric trench and the deep trench is electrically connected to the N+ source region via the filler metal in the source contact hole; the back-side metal serves as a source electrode.

Optionally, the method may include the steps of:

I) growing the P− epitaxial layer over the P+ substrate and successively stacking a gate silicon oxide film, a polysilicon gate and a gate metal silicide layer on the P− epitaxial layer, forming dielectric sidewalls on both sides of the stacked gate silicon oxide film, polysilicon gate and gate metal silicide layer, forming the P-well in an upper portion of the P− epitaxial layer and the N+ source region in the P-well, forming the N+ drain region in an upper portion of the P− epitaxial layer, forming the N− drift region encircling the N+ drain region and being adjacent to the P-well, and forming a source/drain metal silicide layer on a top face of the P− epitaxial layer, the source/drain metal silicide layer covering both the N+ source region and the N+ drain region;

II) depositing an intermediate dielectric layer over the P− epitaxial layer, covering the source/drain metal silicide layer, the stacked gate silicon oxide film, polysilicon gate and gate metal silicide layer and the dielectric sidewalls, and planarizing the intermediate dielectric layer using a CMP process or an etch-back process;

III) performing photolithographic and etching process on the intermediate dielectric layer to form therein a drain contact hole and a source contact hole;

IV) coating a photoresist on a top face of the intermediate dielectric layer and filling the drain contact hole and the source contact hole, opening an area above the gate and a metal plug area which is on one side of the N+ source region farther from the N− drift region by photolithography while leaving the rest areas protected by the photoresist, etching the intermediate dielectric layer to form a gate trench, removing the photoresist, coating photoresist again and only opening the metal plug area by photolithography while leaving the rest areas, including the drain contact hole, the source contact hole and the gate trench, protected by the photoresist, etching the intermediate dielectric layer and the P− epitaxial layer to form a dielectric trench in the intermediate dielectric layer and a deep trench through the P− epitaxial layer, and removing the photoresist;

V) depositing a metal adhesion layer and a metal barrier layer on the metal adhesion layer in each of the drain contact hole, the source contact hole, the gate trench and the deep trench, filling the drain contact hole, the source contact hole, the gate trench and the deep trench with a filler metal, and removing an undesired portion of the filler metal above the intermediate dielectric layer using a CMP process; and VI) forming a front-side metal on the intermediate dielectric layer covering the drain contact hole, the source contact hole, the gate trench and the dielectric trench, grinding the P+ substrate and depositing a back-side metal over the backside of the P+ substrate, wherein a portion of the front-side metal above the gate trench serves as a gate electrode; a portion of the front-side metal above the drain contact hole serves as a drain electrode; a portion of the front-side metal above the source contact hole is connected to a portion of the front-side metal above the dielectric trench by a metal wire such that the filler metal in the dielectric trench and the deep trench is electrically connected to the N+ source region via the filler metal in the source contact hole; the back-side metal serves as a source electrode.

Substitution of the P+ sinker of the conventional RF LDMOS device for the metal plug can reduce a lateral size of the occupied area and hence leads to resistance reduction and an improvement of device performance. Moreover, deposition of filler metal onto the gate of the device can result in the reduction of gate resistance. In addition, as formation of the filler metal on the gate is well compatible with the process of forming the metal plug, no additional cost will be introduced.

BRIEF DESCRIPTION OF THE DRAWINGS

To further describe the present invention, reference is made to the following detailed description on example embodiments, taken in conjunction with the accompanying drawings, in which.

DETAILED DESCRIPTION

Embodiment 1

In this embodiment, a semiconductor device embodying the present invention may be fabricated using a method including the steps discussed in detail below.

Figure 1:
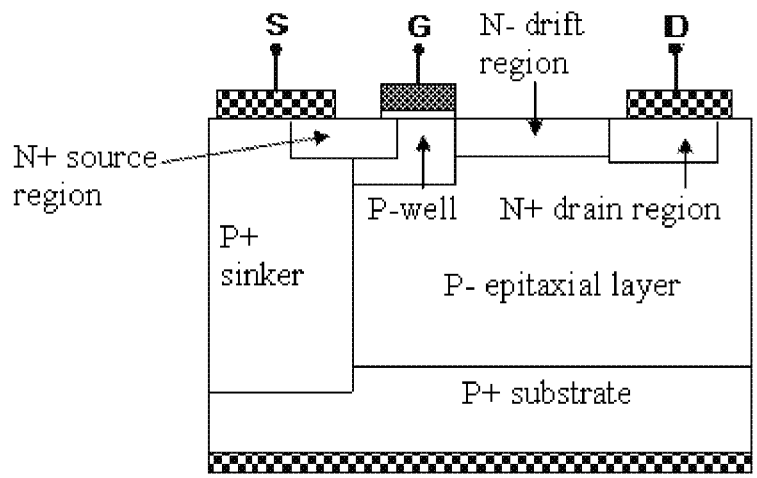
FIG. 1 shows a schematic illustration of a conventional RF LDMOS device.
Figure 2:
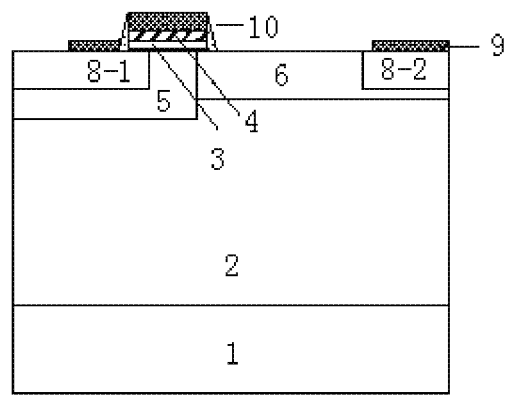
FIG. 2 depicts a structure formed after a gate oxide film, a polysilicon gate, a P-well and a metal silicide layer have been formed.

Turning now to FIG. 2, in a first step of the method, a P– epitaxial layer 2 is formed over a P+ substrate 1 (which is typically doped with boron and has a resistivity of 0.01 Ω·cm to 0.02 Ω·cm). Thickness and doping concentration of the epitaxial layer may be determined by the designed voltage endurance of the semiconductor device being fabricated. For example, a P– epitaxial layer 2 with a resistivity of 10 Ω·cm to 20 Ω·cm and a thickness of 5 μm to 8 μm may be formed to achieve a voltage endurance of 60 V for the device. Next, a gate silicon oxide film 3 having a thickness of, for example, 150 Å to 1000 Å, is deposited over the P– epitaxial layer 2. Moreover, a polysilicon film with a thickness of 1000 Å to 6000 Å is deposited over the gate silicon oxide film 3. Thereafter, a polysilicon gate 4 is formed by a photolithography and etching process, followed by forming a gate metal silicide layer 10 on the polysilicon gate 4. After that, following the forming of a P-well 5 in an upper portion of the P– epitaxial layer 2 by ion implantation and drive-in, an N+ source region 8-1 is formed in the P-well 5, and an N+ drain region 8-2 is formed in an upper portion of the P– epitaxial layer 2, by photolithography and ion implantation. Next, an N– drift region 6 is formed by photolithography and ion implantation in an upper portion of the P– epitaxial layer 2 encircling the N+ drain region 8-2 and being adjacent to the P-well 5. Thereafter, a dielectric film formed of, for example, silicon oxide, silicon nitride, or a combination of the above two, is deposited and then etched to form dielectric sidewalls 7 on both sides of a gate structure jointly constituted by the stacked gate silicon oxide film 3, polysilicon gate 4 and gate metal silicide layer 10. After that, a source/drain metal silicide layer 9 is formed by a metal silicide forming process on a top face of the P– epitaxial layer 2, specifically, above the N+ source region 8-1 and the N+ drain region 8-2, respectively.

Figure 3:
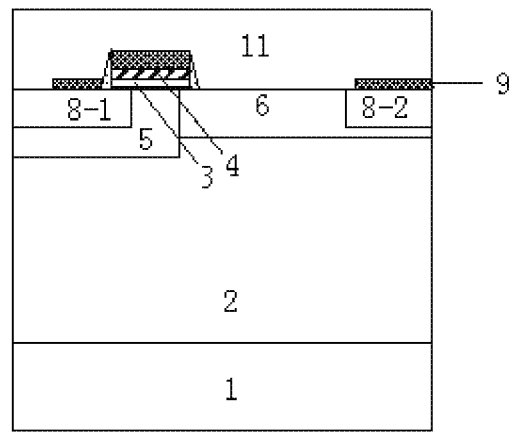
FIG. 3 depicts a structure after an intermediate dielectric layer has been formed.

In a second step, as shown in FIG. 3, an intermediate dielectric layer 11 (which is an inter-polysilicon-and-metal dielectric film) is deposited over the resulting structure after the first step. Next, the intermediate dielectric layer 11 is planarized using a chemical-mechanical polishing (CMP) or etch-back process until its thickness is reduced to 6000 Å to 20000 Å.

Figure 4:
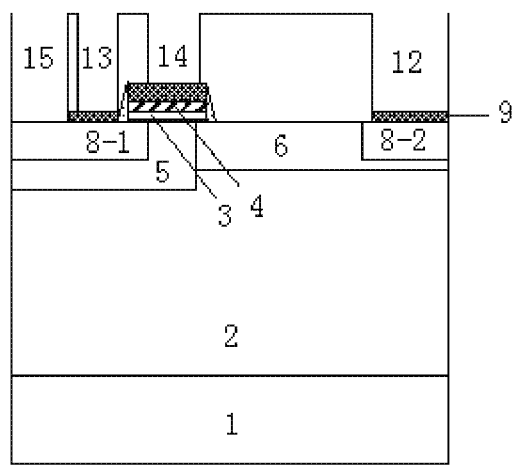
FIG. 4 depicts a structure after the intermediate dielectric layer has been etched.

Referring to FIG. 4, in a third step of the method, a drain contact hole 12 above the N+ drain region 8-2, a source contact hole 13 above the N+ source region 8-1, a gate trench 14 above the gate structure and a dielectric trench 15 on one side of the N+ source region 8-1 that is farther from the N– drift region 6 are individually formed by performing a photolithography and etching process on the intermediate dielectric layer 11, wherein the dielectric trench 15 is opened in a metal plug area where a metal plug is to be formed in a subsequent step.

Figure 5A:
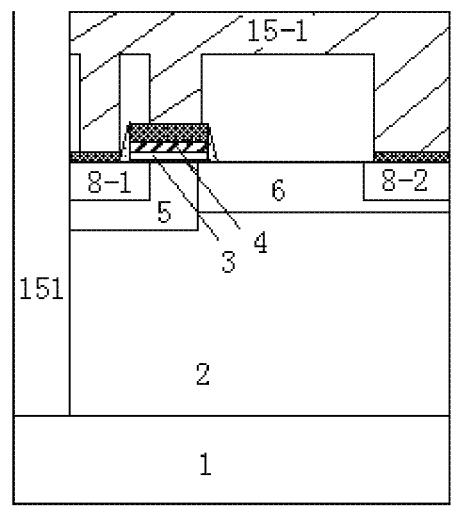
FIG. 5a depicts a structure after a deep trench has been formed using a photolithography-and-etching process of a method in accordance with one embodiment of the present invention.

With reference to FIG. 4 and FIG. 5a, in a fourth step, photoresist 15-1 is coated on the top face of the intermediate dielectric layer 11, filling the drain contact hole 12, the source contact hole 13 and the gate trench 14. Next, a deep trench 151 extending downwards along and under the dielectric trench 15 and through the P– epitaxial layer 2 is formed by etching a portion of the P– epitaxial layer 2 exposed in the dielectric trench 15 while the holes and trenches other than the dielectric trench 15 is being protected.

Figure 5B:
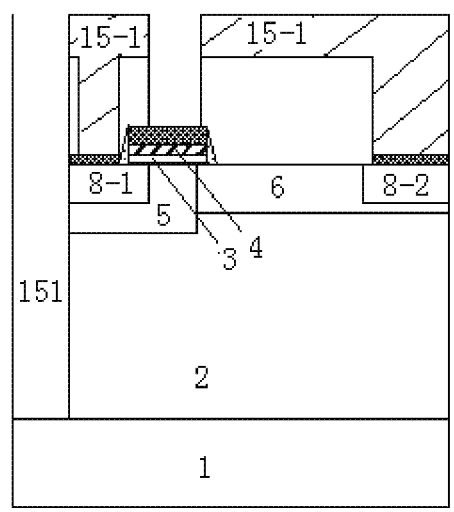
FIG. 5b depicts a structure after a deep trench has been formed using a photolithography-and-etching process of a method in accordance with another embodiment of the present invention.

As a variant, referring to FIG. 4 and FIG. 5b, it is also applicable to coat the photoresist 15-1 on the top face of the intermediate dielectric layer 11, filling the drain contact hole 12 and the source contact hole 13, open the gate trench 14 and the dielectric trench 15 using a photolithography process, and form the deep trench 151 by etching a portion of the P– epitaxial layer 2 exposed in the dielectric trench 15. Next, remove the photoresist 15-1.

The deep trench 151 is formed through the P– epitaxial layer 2 and is in contact with the P+ substrate 1. Typically, the deep trench 151 may have a depth of 0.2 μm greater than the thickness of the P– epitaxial layer 2, in order to ensure a good contact between a metal filled in the deep trench 151 in a subsequent process described in detail below and the P+ substrate 1 underlying the deep trench 151.

Figure 6:
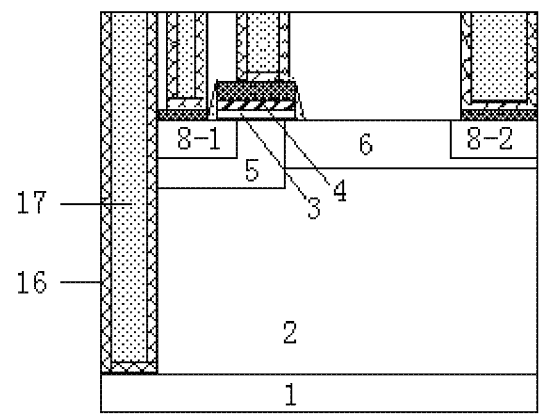
FIG. 6 depicts a structure after a filler metal has been deposited.

In a fifth step, as shown in FIG. 6, a metal adhesion layer (not shown) formed of titanium (Ti) and a metal barrier layer 16 formed of titanium nitride (TiN) on the metal adhesion layer is deposited in each of the drain contact hole 12, the source contact hole 13, the gate trench 14, the dielectric trench 15 and the deep trench 151. Next, the drain contact hole 12, the source contact hole 13, the gate trench 14, the dielectric trench 15 and the deep trench 151 are filled with a filler metal 17, which is selectively tungsten (W) or aluminum-copper alloy (AlCu). Alternatively, a metal adhesion layer formed of Ti and a metal barrier layer 16 formed of tantalum nitride (TaN) on the metal adhesion layer 16 may be first deposited in each of the drain contact hole 12, the source contact hole 13, the gate trench 14 and the deep trench 151, and then copper (Cu), serving as the filler metal 17, is deposited by electroplating in these holes and trenches. Next, an undesired portion of the filler metal 17 that is deposited above the intermediate dielectric layer 11 is removed by using a CMP process.

Figure 7:
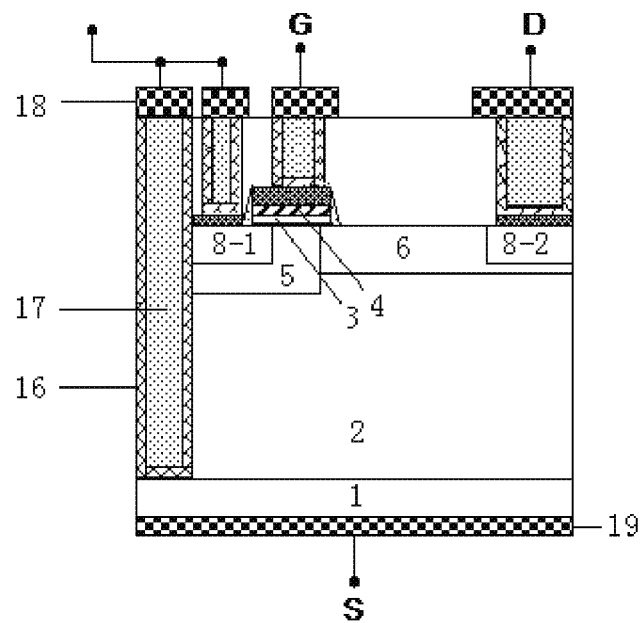
FIG. 7 depicts a structure after a front-side metal and a back-side metal have been formed.

Referring to FIG. 7, in a sixth step of the method, a front-side metal 18 is formed on the intermediate dielectric layer 11. Specifically, the front-side metal 18 is formed on top of the drain contact hole 12, the source contact hole 13, the gate trench 14 and the dielectric trench 15 respectively. A portion of the front-side metal above the gate trench 14 serves as a surface electrode for the gate (i.e., the gate electrode S), a portion above the drain contact hole 12 serves as a surface electrode for the N+ drain region (i.e., the drain electrode D), and portions above the source contact hole 13 and the dielectric trench 15, respectively, are interconnected by a metal wire such that the filler metal 17 in the dielectric trench 15 and the deep trench 151 is electrically connected to the N+ source region 8-1 via the filler metal 17 in the source contact hole 13.

After that, a back-side metal 19 is deposited over a back-side of the P+ substrate 1 after wafer grinding (i.e., the P+ substrate 1 is grinded). The back-side metal 19 picks up a source electrode S. FIG. 7 shows the resulting semiconductor device, in which the filler metal deposited in the deep trench 151 serves as a metal plug which enables the connection between the P+ substrate 1 and the N+ source region 8-1.

Such design overcomes the drawbacks of large lateral size and large electrical resistance in the prior art device in which the connection is realized by a P+ sinker. Additionally, forming the gate trench 14 on top of the polysilicon gate 4 and depositing the filler metal 17 therein leads to further reduction of gate resistance and hence an improvement of device performance.

Embodiment 2

This embodiment provides a method that differs from the method of Embodiment 1 only in that, in the fourth step, with reference to FIG. 5a, photoresist 15-1 is first coated on the top face of the intermediate dielectric layer 11, filling the drain contact hole 12, the source contact hole 13 and the gate trench 14; next, the deep trench 151 is formed by etching a portion of the P– epitaxial layer 2 exposed in the dielectric trench 15 while the holes and trenches other than the dielectric trench 15 is being protected; and thereafter, P-type ions are implanted into side faces of the deep trench 151 by tilted implantation with an ion concentration of 5E17 cm$^{-3}$ to 5E19 cm$^{-3}$. This method can lead to further reduction of the contact resistance between the P-type material and the filler metal and hence an improvement of the performance of the resulting device.

Embodiment 3

This embodiment provides a method that differs from the method of Embodiment 1 only in that, in the third step, only the drain contact hole 12, the source contact hole 13 and the gate trench 14 are formed, and that in the fourth step, a metal plug area is first opened by photolithography to define the dielectric trench 15 while the drain contact hole 12, the source contact hole 13 and the gate trench 14 are being protected by the photoresist 15-1, and then the dielectric trench 15 and the deep trench 151 are formed by etching the intermediate dielectric layer 11 and the P– epitaxial layer 2.

Embodiment 4

This embodiment provides a method that differs from the method of Embodiment 1 only in that, in the third step, only the drain contact hole 12 and the source contact hole 13 are formed, and that in the fourth step, an area above the polysilicon gate 4 and a metal plug area are first opened by photolithography to define the gate trench 14 and the dielectric trench 15, respectively, while the drain contact hole 12 and the source contact hole 13 are being protected by the photoresist 15-1; next, the gate trench 14, the dielectric trench 15 and the deep trench 151 are formed by etching the intermediate dielectric layer 11 and the P– epitaxial layer 2; and thereafter, a portion of the gate metal silicide layer 10 on the polysilicon gate 4 is etched away.

As such, the contact holes (typically, each has a small size of, e.g., 0.2 μm to 1 μm, and takes a small proportion of the total area to be etched) are formed in a different etching process from the trenches (each of the metal plug area and the gate has a certain length and takes a relatively great proportion of the total area to be etched). This can reduce loading effect and improve uniformity of the etching processes. In the case that there has been a trench above the polysilicon gate 4 during the etching process for the deep trench, increasing the etching selectivity ratio between silicon and the gate metal silicide 10, for example, to greater than 100:1, can lead to a good result.

Embodiment 5

This embodiment provides a method that differs from the method of Embodiment 4 only in that, in the third step, only the drain contact hole 12 and the source contact hole 13 are formed, and the fourth step includes: opening an area above the polysilicon gate 4 and a metal plug area by photolithography to define the gate trench 14 while the drain contact hole 12 and the source contact hole 13 are being protected by photoresist; forming the gate trench 14 by etching the intermediate dielectric layer 11; performing another photolithography process to only open the metal plug area to define the dielectric trench 15; and forming the dielectric trench 15 and the deep trench 151 by etching. This method can further reduce process complexity.

Embodiment 6

In this embodiment, the semiconductor device of the present invention may be fabricated using a method including the steps as follows.

Figure 8:
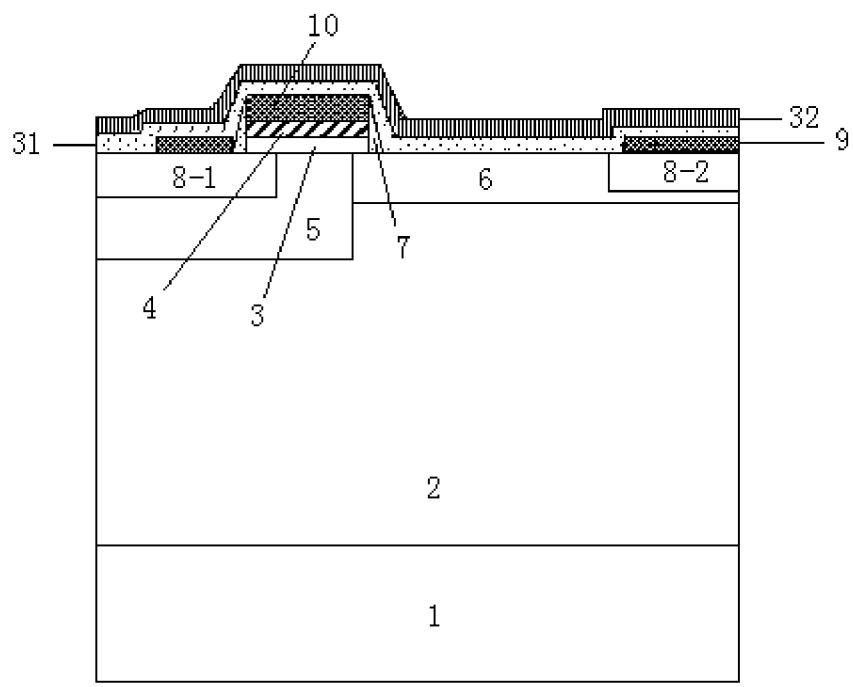
FIG. 8 depicts a structure after a polysilicon gate, a P-well and a metal silicide layer have been formed, and after a shielding metal film has been deposited.

Turning now to FIG. 8, in a first step of the method, a P− epitaxial layer 2 is grown over a P+ substrate 1 (which is typically doped with boron and has a resistivity of 0.01 Ω·cm to 0.02 Ω·cm). Thickness and doping concentration of the epitaxial layer may be determined by the designed voltage endurance of the semiconductor device being fabricated. For example, a P− epitaxial layer 2 with a resistivity of 10 Ω·cm to 20 Ω·cm and a thickness of 5 μm to 8 μm may be formed to achieve a voltage endurance of 60 V for the device. Next, a gate silicon oxide film 3 having a thickness of, for example, 150 Å to 1000 Å, is deposited over the P− epitaxial layer 2. Moreover, a polysilicon film with a thickness of 1000 Å to 6000 Å is deposited over the gate silicon oxide film 3. Thereafter, a polysilicon gate 4 is formed by photolithography and etching, followed by forming a gate metal silicide layer 10 on the polysilicon gate 4. After that, following the forming of a P-well 5 in an upper portion of the P− epitaxial layer 2 by ion implantation and drive-in, an N+ source region 8-1 is formed in the P-well 5, and an N+ drain region 8-2 in an upper portion of the P− epitaxial layer 2, by photolithography and ion implantation. Next, an N− drift region 6 is formed by photolithography and ion implantation in an upper portion of the P− epitaxial layer 2 encircling the N+ drain region 8-2 and being adjacent to the P-well 5. Thereafter, a dielectric film formed of, for example, silicon oxide, silicon nitride, or a combination of the above two, is deposited and then etched to formed dielectric sidewalls 7 on both sides of the stacked gate silicon oxide film 3, polysilicon gate 4 and gate metal silicide layer 10. After that, a source/drain metal silicide layer 9 is formed by a metal silicide forming process on a top face of the P− epitaxial layer 2, specifically, on top of the N+ source region 8-1 and the N+ drain region 8-2, respectively. Next, a dielectric film 31 with a thickness of 100 Å to 2000 Å is deposited over the resulting structure, following by depositing a shielding metal film 32 with a thickness of 200 Å to 3000 Å, formed of W, tungsten-silicon (WSi) alloy, or other metal, over the dielectric film 31.

Figure 9:
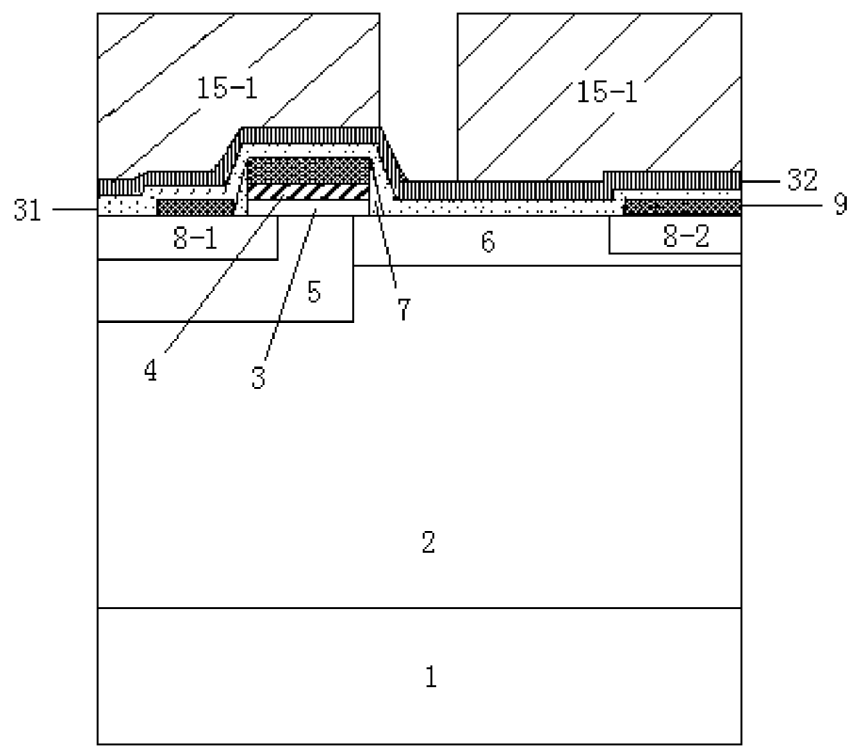
FIG. 9 depicts a structure after the shielding metal film has been processed by photolithography.
Figure 10:
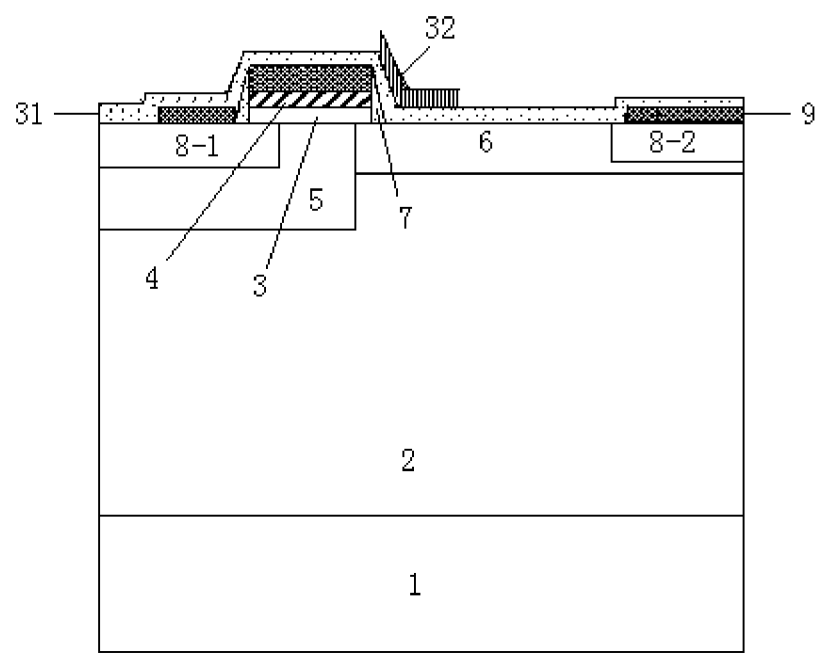
FIG. 10 depicts a structure after the shielding metal film has been patterned.

In a second step, as shown in FIG. 9, photoresist 15-1 is first coated on the shielding metal film 32, and then a pattern to be formed on the shielding metal film is defined on the photoresist by photolithography. Next, with reference to FIG. 10, the shielding metal film is patterned by etching, thereby obtaining a shielding metal pad 32 having a lateral position between the polysilicon gate 4 and the N+ drain region 8-2. The shielding metal pad 32 consists of two portions, in which one extends along a nearer one of the dielectric sidewalls and towards the top of the gate structure, the other one extends a certain distance towards the N+ drain region 8-2.

Figure 11:
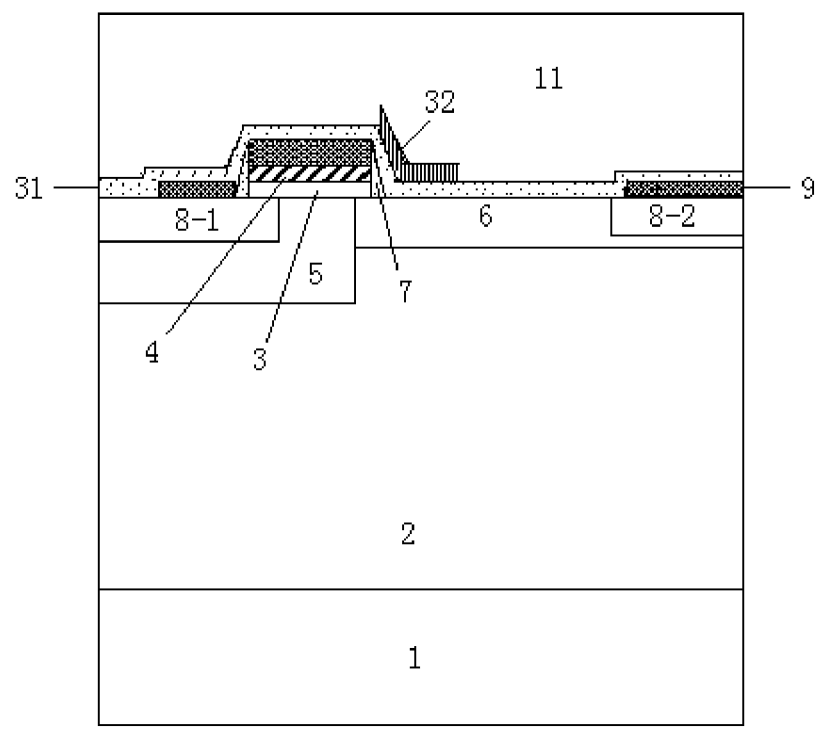
FIG. 11 depicts a structure after an intermediate dielectric layer has been formed.

Referring to FIG. 11, in a third step of the method, an intermediate dielectric layer 11 (which is an inter-polysilicon-and-metal dielectric film) is deposited over the resulting structure. Next, the intermediate dielectric layer 11 is planarized using a chemical-mechanical polishing (CMP) or etch-back process until its thickness is reduced to 6000 Å to 20000 Å.

Figure 12:
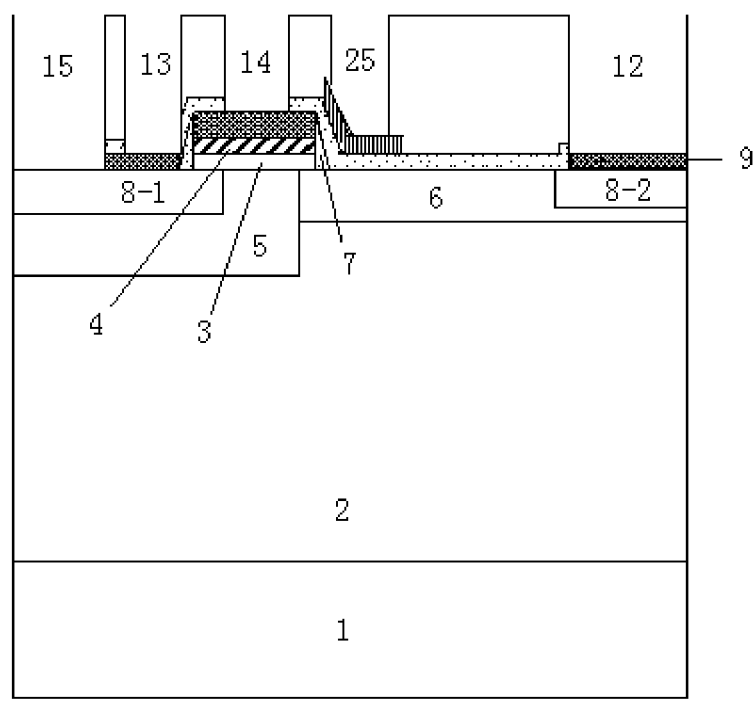
FIG. 12 depicts a structure after the intermediate dielectric layer has been etched.

In a fourth step, with reference to FIG. 12, a drain contact hole 12 above the N+ drain region 8-2, a source contact hole 13 above the N+ source region 8-1, a gate trench 14 above the polysilicon gate structure, an open trench 25 above the shielding metal pad 32 and a dielectric trench 15 in a metal plug area which is on one side of the N+ source region 8-1 farther from the N− drift region 6 are individually formed by performing a photolithography and etching process on the intermediate dielectric layer 11.

Figure 13A:
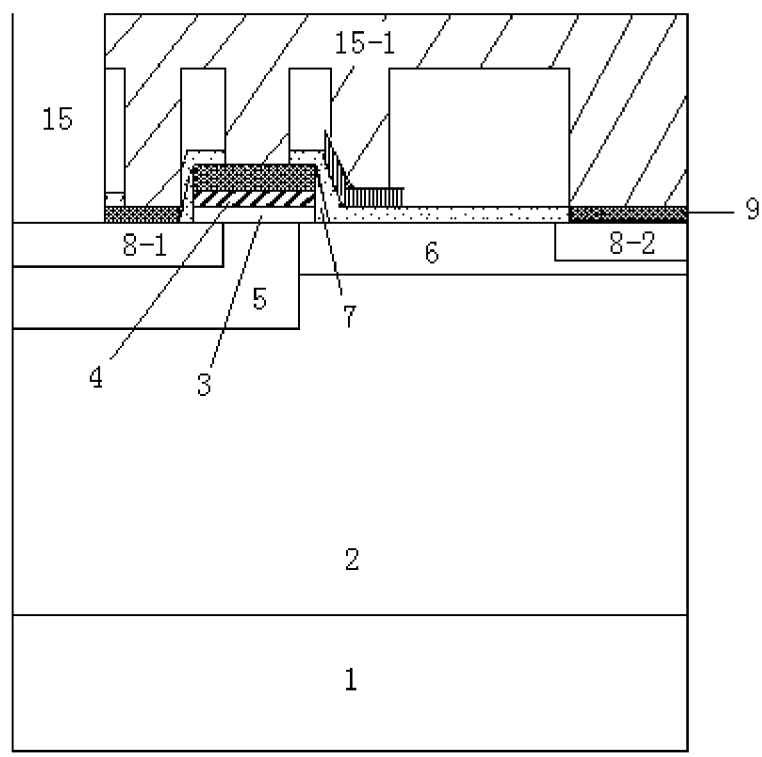
FIG. 13a depicts a structure after a photolithography process for forming a deep trench has been performed in a method in accordance with one embodiment of the present invention.

With reference to FIG. 12 and FIG. 13a, in a fifth step, photoresist 15-1 is coated on the top face of the intermediate dielectric layer 11, filling the drain contact hole 12, the source contact hole 13, the gate trench 14, the open trench 25 and the dielectric trench 15. Next, the dielectric trench 15 is opened by photolithography while the holes and trenches other than the dielectric trench 15 are being protected by photoresist. Thereafter, a deep trench 151 extending downwards along and under the dielectric trench 15 and through the P− epitaxial layer 2 is formed by etching a portion of the P− epitaxial layer 2 exposed in the dielectric trench 15. After that, the photoresist 15-1 is removed (as shown in FIG. 14).

Figure 13B:
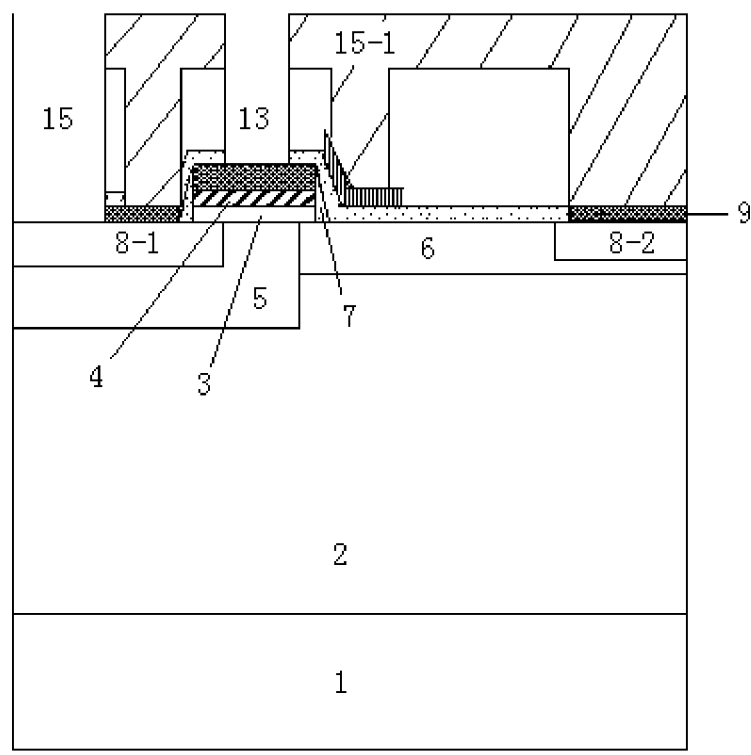
FIG. 13b depicts a structure after a photolithography process for forming a deep trench has been performed in a method in accordance with another embodiment of the present invention.
Figure 14:
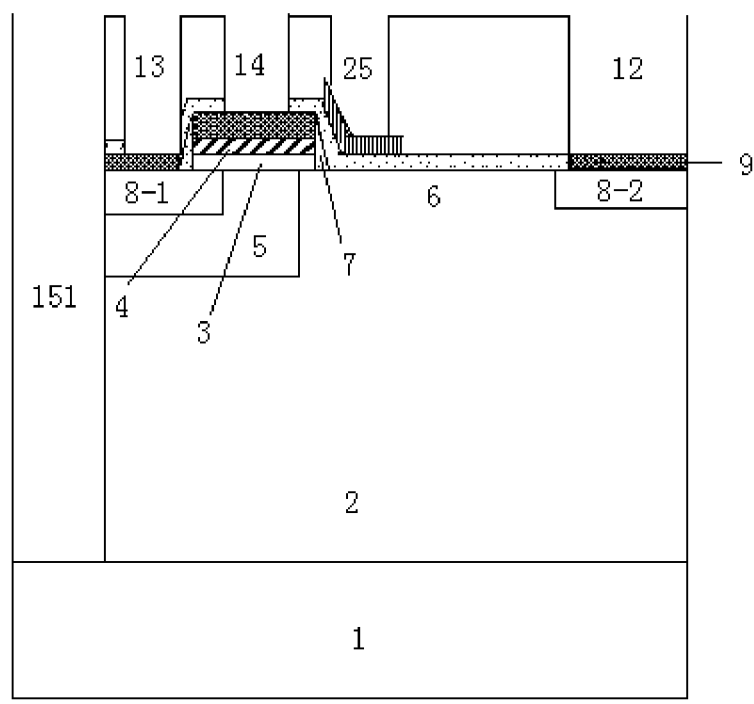
FIG. 14 depicts a structure after the deep trench has been formed by performing an etching process.

As a variant, referring to FIG. 12 and FIG. 13b, in this step, it is also applicable to coat the photoresist 15-1 on the top face of the intermediate dielectric layer 11, filling drain contact hole 12, the source contact hole 13, the gate trench 14, the open trench 25 and the dielectric trench 15, open the gate trench 14 and the dielectric trench 15 using a photolithography process, form the deep trench 151 by etching a portion of the P− epitaxial layer 2 exposed in the dielectric trench 15, and remove the photoresist 15-1 (as shown in FIG. 14).

Figure 15:
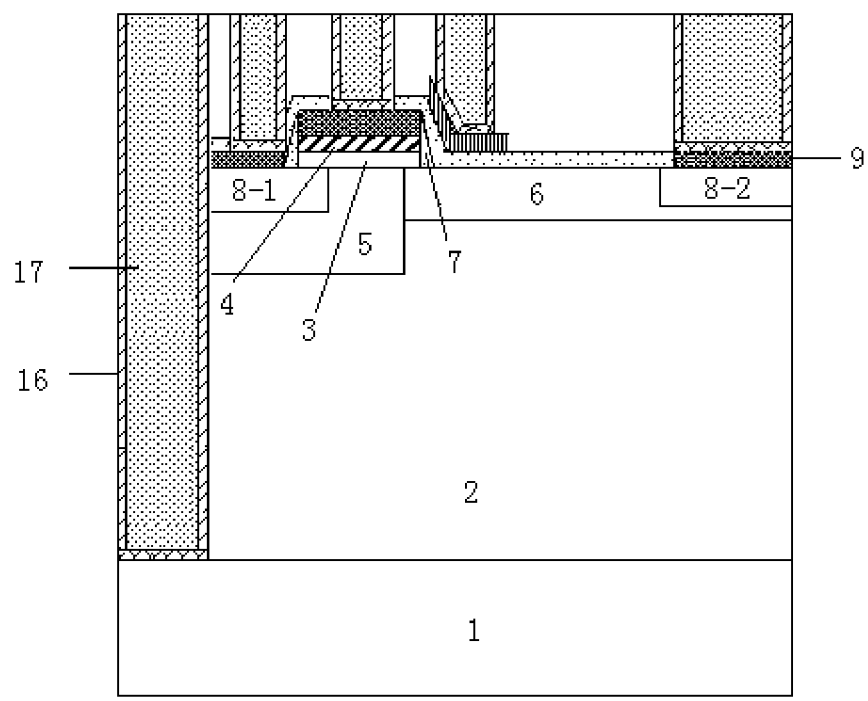
FIG. 15 depicts a structure after a filler metal has been deposited.

In a sixth step, as shown in FIG. 15, a metal adhesion layer (not shown) formed of Ti and a metal barrier layer 16 formed of TiN on the metal adhesion layer is deposited in each of the drain contact hole 12, the source contact hole 13, the gate trench 14, the open trench 25 and the dielectric trench 15. Next, the drain contact hole 12, the source contact hole 13, the gate trench 14, the open trench 25 and the dielectric trench 15 are fully filled with a filler metal 17, which is selectively W or AlCu.

Alternatively, a metal adhesion layer formed of Ti and a metal barrier layer 16 formed of TiN on the metal adhesion layer 16 may be first deposited in each of the drain contact hole 12, the source contact hole 13, the gate trench 14, the open trench 25 and the dielectric trench 15, and then Cu, as the filler metal 17, is deposited by electroplating in the drain contact hole 12, the source contact hole 13, the gate trench 14, the open trench 25 and the dielectric trench 15.

Next, an undesired portion of the filler metal 17 that is deposited above the intermediate dielectric layer 11 is removed using a CMP process.

Figure 16:
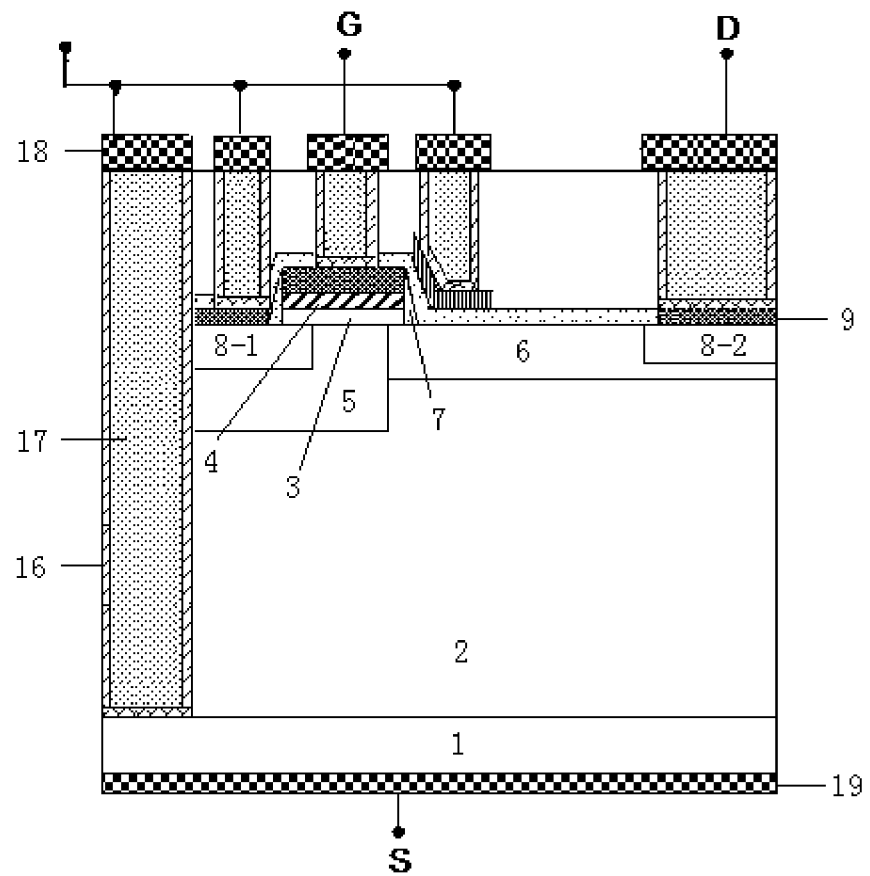
FIG. 16 depicts a structure after a front-side metal and a back-side metal have been formed.

Referring to FIG. 16, in a seventh step of the method, a front-side metal 18 is formed on the intermediate dielectric layer 11. Specifically, the front-side metal 18 is formed on the filler metal 17 filled in the drain contact hole 12, the source contact hole 13, the gate trench 14, the open trench 25 and the dielectric trench 15 respectively. A portion of the front-side metal above the gate trench 14 serves as a surface electrode for the gate (i.e., the gate electrode S), a portion above the drain contact hole 12 serves as a surface electrode for the drain region (i.e., the drain electrode D), and a portion above the dielectric trench 15 is interconnected with portions above the source contact hole 13 and the open trench 25, respectively, by metal wires such that the filler metal 17 in the dielectric trench 15 and the deep trench 151 is electrically connected to the N+ source region 8-1 and the shielding metal pad 32 respectively via the filler metal 17 in the source contact hole 13 and the filler metal 17 in the open trench 25.

After that, a back-side metal 19 is deposited over a backside of the P+ substrate 1 after wafer grinding (i.e., the P+ substrate 1 is grinded). The backside metal 19 picks up a source electrode S. The resulting semiconductor device is as shown in FIG. 16.

In this device, the filler metal 17 deposited in the deep trench 151 serves as a metal plug which enables the electrical connection between the P+ substrate 1 and the N+ source region 8-1. Such design overcomes the drawbacks of large lateral size and large electrical resistance in the prior art device in which the connection is realized by a P+ sinker. Moreover, forming the gate trench 14 on top of the polysilicon gate 4 and depositing the filler metal 17 therein leads to further reduction of gate resistance and hence an improvement of device performance. Furthermore, forming a trench above the shielding metal pad 32 and filling metal therein leads to a better isolation between the gate and the drain, which also contributes to the improvement of the device performance.

Embodiment 7

This embodiment provides a method that differs from the method of Embodiment 6 only in that, in the fourth step, with reference to FIG. 13a, after the deep trench 151 is formed, P-type ions are implanted into side faces of the deep trench 151 by tilted implantation to with an ion concentration of 5E17 $cm^{-3}$ to 5E19 $cm^{-3}$. This method can lead to further reduction of P-type material-metal contact resistance and hence an improvement of the device performance.

Embodiment 8

This embodiment provides a method that differs from the method of Embodiment 6 only in that, in the third step, only the drain contact hole 12, the source contact hole 13, the gate trench 14 and the open trench 25 are formed, and that in the fourth step, a metal plug area is first opened by photolithography while the drain contact hole 12, the source contact hole 13, the gate trench 14 and the open trench 25 are being protected by photoresist, and then the dielectric trench 15 and the deep trench 151 are formed by etching the intermediate dielectric layer 11 and the P− epitaxial layer 2.

Embodiment 9

This embodiment provides a method that differs from the method of Embodiment 6 only in that, in the third step, only the drain contact hole 12 and the source contact hole 13 are formed, and that in the fourth step, an area above the polysilicon gate 4, a metal plug area and an area above the shielding metal pad 32 are first opened by photolithography, while the drain contact hole 12 and the source contact hole 13 are being protected by photoresist; next, the gate trench 14, the dielectric trench 15, the deep trench 151 and the open trench 25 are formed by etching the intermediate dielectric layer 11 and the P− epitaxial layer 2; and thereafter, a portion of the gate metal silicide layer 10 that is formed on the polysilicon gate 4 is etched away.

As such, the contact holes (typically, each has a small size of, e.g., 0.2 μm to 1 μm, and takes a small proportion of the total area to be etched) are formed in a different etching process from the trenches (each of the metal plug area, the gate and the shielding metal pad has a certain length and takes a relatively great proportion of the total area to be etched). This can reduce loading effect and improve uniformity of the etching processes. In the case that there has been a trench above the polysilicon gate 4 during the etching process for the deep trench, increasing the etching selectivity ratio between silicon and the gate metal silicide 10, for example, to greater than 100:1, can lead to a good result.

Embodiment 10

This embodiment provides a method that differs from the method of Embodiment 9 only in that, in the third step, only the drain contact hole 12 and the source contact hole 13 are formed, and the fourth step includes: opening an area above the polysilicon gate 4, a metal plug area and an area above the shielding metal pad 32 by photolithography while the drain contact hole 12 and the source contact hole 13 are being protected by photoresist; forming the gate trench 14 and the open trench 25 by etching the intermediate dielectric layer 11; performing another photolithography process to only open the metal plug area; and forming the dielectric trench 15 and the deep trench 151 by etching.

The method in this embodiment can further reduce process complexity.

The specific embodiments disclosed above are solely for describing the present invention and are not intended to limit the invention in any way. Those skilled in the art can make various modifications and variations, for example, not including the gate metal silicide layer 10 on the polysilicon gate 4, without departing from the scope of the invention. Thus, it is intended that the present invention embrace all such modifications and variations.

What is claimed is:

1. A method for fabricating a semiconductor device, comprising the steps of:
   providing a P+ substrate;
   forming a P− epitaxial layer over the P+ substrate;
   forming a P-well and an N− drift region in an upper portion of the P− epitaxial layer, the P-well and the N− drift region being laterally adjacent to each other;
   forming an N+ source region in the P-well, the N+ source region being connected to a front-side metal via a first contact electrode;
   forming an N+ drain region in the N− drift region, the N+ drain region being connected to the front-side metal via a second contact electrode;
   forming a gate structure on the P− epitaxial layer, the gate structure being connected to the front-side metal via a third contact electrode; and
   forming a metal plug through the P− epitaxial layer, the metal plug having one end in contact with the P+ substrate and the other end connected to the front-side metal, the metal plug being adjacent to one side of the N+ source region that is farther from the N− drift region,
   wherein the method further comprises the steps of:
   1) growing the P− epitaxial layer over the P+ substrate and successively stacking a gate silicon oxide film, a polysilicon gate and a gate metal silicide layer on the P− epitaxial layer, forming dielectric sidewalls on both sides of the stacked gate silicon oxide film, polysilicon gate and gate metal silicide layer, forming the P-well in an upper portion of the P– epitaxial layer and the N+ source region in the P-well, forming the N+ drain region in an upper portion of the P– epitaxial layer, forming the N– drift region encircling the N+ drain region and being adjacent to the P-well, and forming a source/drain metal silicide layer on a top face of the P– epitaxial layer, the source/drain metal silicide layer covering both the N+ source region and the N+ drain region;

2) depositing an intermediate dielectric layer over the P– epitaxial layer, covering the source/drain metal silicide layer, the stacked gate silicon oxide film, polysilicon gate and gate metal silicide layer and the dielectric sidewalls, and planarizing the intermediate dielectric layer using a CMP process or an etch-back process;

3) performing photolithographic and etching process on the intermediate dielectric layer to form therein a drain contact hole, a source contact hole, a gate trench above the gate, and a dielectric trench for the metal plug on one side of the N+ source region that is farther from the N– drift region;

4) coating a photoresist on a top face of the intermediate dielectric layer and filling the drain contact hole, the source contact hole, the gate trench and the dielectric trench, opening the dielectric trench by photolithography while leaving the rest portions protected by the photoresist or opening the gate trench and the dielectric trench by photolithography while leaving the rest portions protected by the photoresist, etching in the dielectric trench to form a deep trench through the P– epitaxial layer, and removing the photoresist;

5) depositing a metal adhesion layer and a metal barrier layer on the metal adhesion layer in each of the drain contact hole, the source contact hole, the gate trench, the dielectric trench and the deep trench, filling the drain contact hole, the source contact hole, the gate trench, the dielectric trench and the deep trench with a filler metal, and removing an undesired portion of the filler metal above the intermediate dielectric layer using a CMP process; and 6) forming a front-side metal on the intermediate dielectric layer covering the drain contact hole, the source contact hole, the gate trench and the dielectric trench, grinding the P+ substrate and depositing a back-side metal over the backside of the P+ substrate, wherein a portion of the front-side metal above the gate trench serves as a gate electrode; a portion of the front-side metal above the drain contact hole serves as a drain electrode; a portion of the front-side metal above the source contact hole is connected to a portion of the front-side metal above the dielectric trench by a metal wire such that the filler metal in the dielectric trench and the deep trench is electrically connected to the N+ source region via the filler metal in the source contact hole; the back-side metal serves as a source electrode.

2. A method for fabricating a semiconductor device, comprising the steps of:

providing a P+ substrate;
forming a P– epitaxial layer over the P+ substrate;
forming a P-well and an N– drift region in an upper portion of the P– epitaxial layer, the P-well and the N– drift region being laterally adjacent to each other;
forming an N+ source region in the P-well, the N+ source region being connected to a front-side metal via a first contact electrode;

forming an N+ drain region in the N– drift region, the N+ drain region being connected to the front-side metal via a second contact electrode;
forming a gate structure on the P– epitaxial layer, the gate structure being connected to the front-side metal via a third contact electrode; and
forming a metal plug through the P– epitaxial layer, the metal plug having one end in contact with the P+ substrate and the other end connected to the front-side metal, the metal plug being adjacent to one side of the N+ source region that is farther from the N– drift region, wherein the method further comprises the steps of:
I) growing the P– epitaxial layer over the P+ substrate and successively stacking a gate silicon oxide film, a polysilicon gate and a gate metal silicide layer on the P– epitaxial layer, forming dielectric sidewalls on both sides of the stacked gate silicon oxide film, polysilicon gate and gate metal silicide layer, forming the P-well in an upper portion of the P– epitaxial layer and the N+ source region in the P-well, forming the N+ drain region in an upper portion of the P– epitaxial layer, forming the N– drift region encircling the N+ drain region and being adjacent to the P-well, and forming a source/drain metal silicide layer on a top face of the P– epitaxial layer, the source/drain metal silicide layer covering both the N+ source region and the N+ drain region;

II) depositing an intermediate dielectric layer over the P– epitaxial layer, covering the source/drain metal silicide layer, the stacked gate silicon oxide film, polysilicon gate and gate metal silicide layer and the dielectric sidewalls, and planarizing the intermediate dielectric layer using a CMP process or an etch-back process;

III) performing photolithographic and etching process on the intermediate dielectric layer to form therein a drain contact hole and a source contact hole;

IV) coating a photoresist on a top face of the intermediate dielectric layer and filling the drain contact hole and the source contact hole, opening an area above the gate and a metal plug area which is on one side of the N+ source region farther from the N– drift region by photolithography while leaving the rest areas protected by the photoresist, etching the intermediate dielectric layer to form a gate trench, removing the photoresist, coating photoresist again and only opening the metal plug area by photolithography while leaving the rest areas, including the drain contact hole, the source contact hole and the gate trench, protected by the photoresist, etching the intermediate dielectric layer and the P– epitaxial layer to form a dielectric trench in the intermediate dielectric layer and a deep trench through the P– epitaxial layer, and removing the photoresist;

V) depositing a metal adhesion layer and a metal barrier layer on the metal adhesion layer in each of the drain contact hole, the source contact hole, the gate trench and the deep trench, filling the drain contact hole, the source contact hole, the gate trench and the deep trench with a filler metal, and removing an undesired portion of the filler metal above the intermediate dielectric layer using a CMP process; and VI) forming a front-side metal on the intermediate dielectric layer covering the drain contact hole, the source contact hole, the gate trench and the dielectric trench, grinding the P+ substrate and depositing a back-side metal over the backside of the P+ substrate, wherein a portion of the front-side metal above the gate trench serves as a gate electrode; a portion of the front-side metal above the drain contact hole serves as a drain electrode; a portion of the front-side metal above the source contact hole is connected to a portion of the front-side metal above the dielectric trench by a metal wire such that the filler metal in the dielectric trench and the deep trench is electrically connected to the N+ source region via the filler metal in the source contact hole; the back-side metal serves as a source electrode.

* * * * *